(12) United States Patent
Ayel et al.

(10) Patent No.: US 12,113,137 B2
(45) Date of Patent: Oct. 8, 2024

(54) SPAD-TYPE PHOTODIODE

(71) Applicant: Commissariat à l'Énergie Atomique et aux Énergies Alternatives, Paris (FR)

(72) Inventors: François Ayel, Grenoble (FR); Olivier Saxod, Grenoble (FR); Norbert Moussy, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 184 days.

(21) Appl. No.: 17/483,390

(22) Filed: Sep. 23, 2021

(65) Prior Publication Data

US 2022/0093807 A1 Mar. 24, 2022

(30) Foreign Application Priority Data

Sep. 24, 2020 (FR) ........................................ 2009721

(51) Int. Cl.
*H01L 31/02* (2006.01)
*H01L 31/0224* (2006.01)
*H01L 31/0352* (2006.01)
*H01L 31/107* (2006.01)

(52) U.S. Cl.
CPC ............. *H01L 31/02027* (2013.01); *H01L 31/022408* (2013.01); *H01L 31/0352* (2013.01); *H01L 31/107* (2013.01)

(58) Field of Classification Search
CPC ....... H01L 31/02027; H01L 31/022408; H01L 31/0352; H01L 31/107; H01L 31/1075; H01L 31/035272; H01L 31/18
See application file for complete search history.

(56) References Cited

U.S. PATENT DOCUMENTS

| | | | | |
|---|---|---|---|---|
| 2007/0045794 A1* | 3/2007 | Yaung | ................. | H01L 31/103 257/678 |
| 2010/0127314 A1* | 5/2010 | Frach | ................. | H01L 31/1804 257/292 |
| 2014/0291481 A1 | 10/2014 | Zhang et al. | | |
| 2015/0171129 A1* | 6/2015 | Sakurano | ......... | H01L 27/14638 438/73 |
| 2015/0219685 A1* | 8/2015 | Humphris | ............ | G01Q 70/06 850/1 |

(Continued)

FOREIGN PATENT DOCUMENTS

EP  3 151 290 A1  4/2017

OTHER PUBLICATIONS

FR2009721, Jun. 10, 2021, Preliminary Search Report.

(Continued)

*Primary Examiner* — Sitaramarao S Yechuri
(74) *Attorney, Agent, or Firm* — Wolf, Greenfield & Sacks, P.C.

(57) ABSTRACT

A SPAD-type photodiode comprising a depletion area in a first portion of a semiconductor substrate of a first conductivity type and further comprising a gate electrically-insulated from the substrate, extending into the substrate from an upper surface of the substrate, and separating the first portion of the substrate from a second portion. The photodiode further comprises a first region of the second conductivity type extending from the upper surface of the substrate into the second portion.

12 Claims, 10 Drawing Sheets

(56) References Cited

U.S. PATENT DOCUMENTS

| | | |
|---|---|---|
| 2017/0092801 A1 | 3/2017 | Moussy et al. |
| 2018/0019268 A1 | 1/2018 | Zhang et al. |
| 2018/0026147 A1* | 1/2018 | Zhang .................. G04F 10/005 257/292 |
| 2018/0090536 A1 | 3/2018 | Mandai et al. |
| 2018/0359434 A1* | 12/2018 | Tanaka .................. H04N 23/54 |

OTHER PUBLICATIONS

Preliminary Search Report for French Application No. 2009721, dated Jun. 10, 2021.
Gola et al. A passive-quenching active-recharge analog silicon photomultiplier. IEEE Journal of Selected Topics in Quantum Electronics. Jun. 25, 2014;20(6):1-9.

* cited by examiner

SPAD-TYPE PHOTODIODE

The present patent application claims the priority of the French patent application FR20/09721 which will be considered as forming an integral part of the present description.

TECHNICAL BACKGROUND

The present application concerns the field of avalanche photodiodes for the detection of single photons, also called SPAD ("Single Photon Avalanche Diode") photodiodes.

PRIOR ART

A SPAD photodiode is essentially formed by a PN junction reverse biased at a voltage greater than its avalanche threshold. When no electric charge is present in the depletion area or space charge area of the PN junction, the photodiode is in a non-conductive pseudo-steady state. When a photo-generated electric charge is injected into the depletion area, if the displacement speed of this charge in the depletion area is sufficiently high, that is, if the electric field in the depletion area is sufficiently intense, the photodiode is capable of avalanching. A single photon is thus capable of generating a measurable electric signal, and this, with a very short response time. SPAD photodiodes enable to detect radiations of very low intensity, and are in particular used for single photon detection and photon counting.

It would be desirable to at least partly improve certain aspects of known SPAD photodiodes. In particular, false detections may occur with known SPADs.

SUMMARY

An embodiment overcomes all or part of the disadvantages of known SPAD photodiodes.

An object of an embodiment is to decrease, or even to suppress, false detections.

An embodiment provides a SPAD-type photodiode comprising a depletion area in a first portion of a semiconductor substrate of a first conductivity type and further comprising a gate electrically insulated from the substrate, extending into the substrate from an upper surface of the substrate, and separating the first portion of the substrate from a second portion, the photodiode further comprising a first region of the second conductivity type extending from the upper surface of the substrate into the second portion.

According to an embodiment, the photodiode further comprises a circuit of application of a bias voltage to said depletion area, said voltage being equal in absolute value to a first value greater than the avalanche voltage of the photodiode during a first phase and equal in absolute value to a second value smaller than the first value during a second phase, and of application of a potential to the gate at a third value adapted to repelling the minority free charge carriers of the substrate during the first phase and at a fourth value adapted to attracting the minority free charge carriers of the substrate during part of the second phase.

According to an embodiment, the doping level of the substrate is smaller than $5*10^{14}$ atoms/cm$^3$.

According to an embodiment, the photodiode comprises, in the first portion of the substrate:
- a second region of the second conductivity type extending from the upper surface of the substrate; and
- a third region of the first conductivity type having a doping level greater than that of the substrate, extending from the lower surface of the second region opposite to the upper surface of the substrate, the third region having, in top view, a surface area smaller than that of the second region and being located opposite a central portion of the second region.

According to an embodiment, the photodiode further comprises:
- a fourth region of the first conductivity type having a doping level greater than that of the substrate extending from the upper surface of the substrate; and
- a fifth buried region of the first conductivity type having a doping level greater than that of the substrate, forming a peripheral ring connecting the third region to the fourth region so that the lateral surfaces and the lower surface of the second region are totally surrounded by the assembly formed by the third, fourth, and fifth regions.

According to an embodiment, the fourth region laterally surrounds the second region.

According to an embodiment, the doping level of the fourth region is greater than or equal to that of the third region.

According to an embodiment, the thicknesses E105 and E111 of the third and fifth regions and the doping levels C105 and C111 of the third and fifth regions are such that product C111*E111 is greater than or equal to product C105*E105.

According to an embodiment, the fourth and fifth regions are not in contact with the second region.

According to an embodiment, the depth of the gate in the substrate with respect to the upper surface of the substrate is greater than the depth of the lower surface of the third region with respect to the upper surface of the substrate.

According to an embodiment, the depth of the gate in the substrate with respect to the upper surface of the substrate is greater than the depth of the lower surface of the fifth region with respect to the upper surface of the substrate.

An embodiment also provides a method of controlling a photodiode such as previously defined, comprising:
- the application of a bias voltage to said depletion area, said voltage being equal in absolute value to a first value greater than the avalanche voltage of the photodiode during a first phase and equal in absolute value to a second value smaller than the first value during a second phase; and
- the application of a potential to the gate at a third value adapted to repelling the minority free charge carriers of the substrate during the first phase and at a fourth value adapted to attracting the minority free charge carriers of the substrate during part of the second phase.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
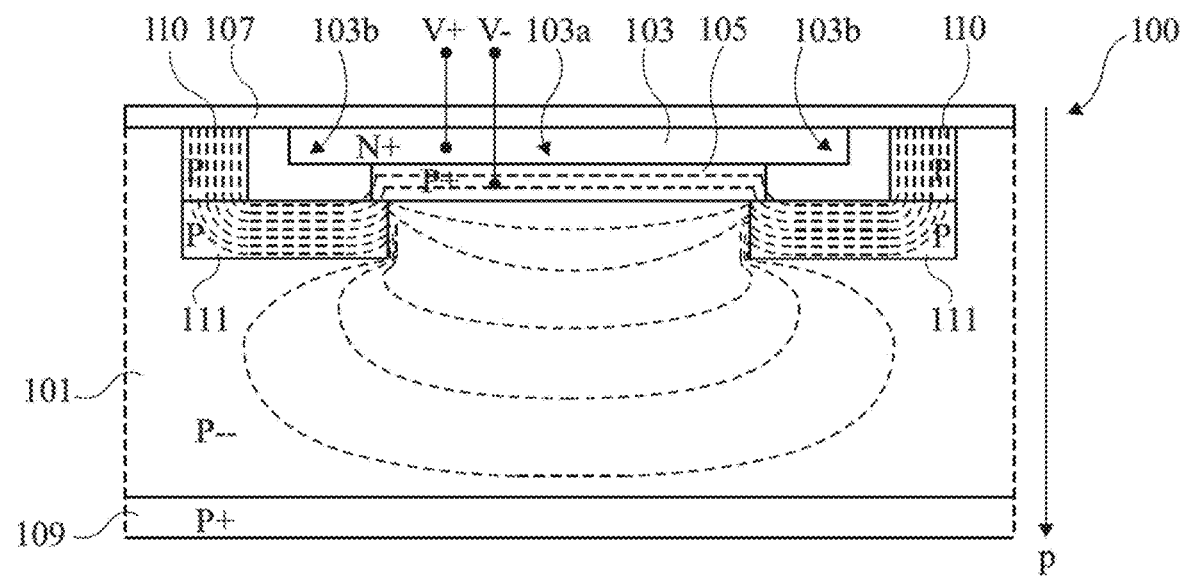
FIG. 1 is a partial simplified cross-section view of an example of a SPAD photodiode.

Like features have been designated by like references in the various figures. In particular, the structural and/or functional features that are common among the various embodiments may have the same references and may dispose identical structural, dimensional and material properties. Further, the various drawings are not to scale.

For the sake of clarity, only the steps and elements that are useful for an understanding of the embodiments described herein have been illustrated and described in detail. In particular, a SPAD photodiode generally comprises secondary circuits, particularly a circuit for biasing its PN junction to a voltage greater than its avalanche threshold, as well as a quenching circuit having the function of interrupting the avalanche of the photodiode once it has been triggered. Such secondary circuits have not been shown in the drawings and will not be detailed, the described embodiments being compatible with the secondary circuits equipping known SPAD photodiodes.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures. Unless specified otherwise, the expressions "around", "approximately", "substantially" and "in the order of" signify within 10%, and preferably within 5%. Unless specified otherwise, the expressions "around", "approximately", "substantially" and "in the order of" signify within 10%, and preferably within 5%.

FIG. 1 is a partial simplified cross-section view of an example of a SPAD photodiode 100. Photodiode 100 comprises a semiconductor substrate 101, for example, made of silicon. In the shown example, substrate 101 is P-type doped. Photodiode 101 further comprises, in an upper portion of substrate 101, an N-type doped region 103 extending from the upper surface of the substrate and, under region 103, a P-type doped region 105, having a doping level greater than that of substrate 101, extending from the lower surface of region 103. As an example, region 103 has a thickness in the range from 50 nm to 250 nm, and region 105 has a thickness in the range from 100 nm to 500 nm. Region 105 has, in top view, a surface area smaller than that of region 103, and is located opposite a central portion 103a of region 103. A peripheral ring-shaped region 103b of region 103 thus laterally extends beyond the periphery of region 105. As an example, the width of peripheral region 103b is in the range from 0.1 μm to 2 μm.

In the shown example, the lower surface and the lateral surface of peripheral region 103b of region 103 are in contact with substrate 101. Central region 103a of region 103 has its lower surface in contact with the upper surface of region 105. Thus, the PN junction of photodiode 100 comprises a central portion formed between region 105 and central portion 103a of region 103, and a peripheral portion formed between substrate 101 and the peripheral portion 103b of region 103. In top view (not shown), regions 103 and 105 for example have a circular or rounded-edge square shape. The described embodiments are however not limited to this specific case. In the shown example, photodiode 100 further comprises a passivation layer 107, for example, made of silicon oxide, covering the upper surface of substrate 101. In the shown example, passivation layer 107 covers the entire surface of the photodiode. Passivation layer 107 may comprise openings (not shown) opposite contacting regions (not shown) for the biasing of substrate 101. Contact metallizations can then be formed in these openings. In this example, photodiode 100 further comprises, in a lower portion of substrate 101, a P-type doped region 109, having a lower doping level than that of substrate 101, extending in substrate 101 from its lower surface. As an example, layer 109 may be an initial substrate, for example, having a thickness from 700 μm to 850 μm, having substrate 101 formed by epitaxy on its upper surface. As a variation, layer 109 may be the upper single-crystal silicon layer of a stack of silicon-on-insulator (SOI) type, having substrate 101 formed on its upper surface by epitaxy. Layer 109 for example extends over substantially the entire surface of substrate 101. The thickness of substrate 101 located under region 105, that is, between the lower surface of region 105 and the upper surface of layer 109 in the shown example, is for example in the range from 1 μm to 20 μm.

SPAD photodiode 100 further comprises a P-type region 110, having a doping level greater than that of substrate 101, extending vertically into substrate 101 from its upper surface, down to a depth greater than that of region 103, and forming a peripheral ring totally surrounding region 103 in top view. As an example, the doping level of region 110 is between the doping level of the substrate and the doping level of region 105. As a variation, the doping level of region 110 is greater than that of region 105. A non-zero distance preferably separates region 103 from region 110, for example, a distance in the range from 0.5 µm to 5 µm. In this example, region 110 extends down to a depth smaller than the thickness of substrate 101, for example, down to a depth substantially equal to that of the lower surface of region 105.

Photodiode 100 further comprises a buried P-type region 111, having doping level greater than that of substrate 101, having its upper surface located at a depth greater than that of region 103, for example, at a depth greater than or equal to that of the lower surface of region 105. Region 111 extends, in particular, under the peripheral region 103b of region 103. Region 111 forms a buried ring connecting region 110 to region 105 all along the periphery of the PN junction. Thus, regions 110, 111, and 105 form a continuous separation well entirely surrounding the lateral surfaces and the lower surface of region 103, and interposing between region 103 and the lower portion of substrate 101. The doping level of region 111 is for example identical or similar to that of region 105. In this example, region 111 extends down to a depth smaller than that of the lower surface of substrate 101. As an example, the thickness of region 111 is in the range from 200 nm to 600 nm. Calling E105 the thickness of region 105, C105 the average concentration of dopant elements in region 105, E111 the thickness of region 111, and C111 the average concentration of dopant elements in region 111, values E105, C105, E111, C111 are for example such that product C111*E111 is approximately equal to product C105*E105, the difference between product C111*E111 and product C105*E105 being preferably smaller than 10% of product C111*E111.

In operation, region 103, forming the photodiode cathode, is biased to a potential V+, and region 105, forming the photodiode anode, is biased to a potential V−, so that the cathode-anode voltage of the photodiode is greater than its avalanche voltage. For simplification, the contact terminals enabling to bias the photodiode have not been shown. As an example, the biasing of the anode region of the photodiode may be performed via regions 110 and 111. To achieve this, a connection metallization (not shown) may be arranged in contact with the upper surface of region 110, in an opening (not shown) formed in passivation layer 107.

When photodiode 100 is reverse-biased, an electric field appears at the PN junction of the photodiode. FIG. 1 shows in dashed lines the equipotential lines in substrate 101 when photodiode 100 is reverse biased.

The doping levels of regions 101, 103, 105, 110, and 111, the distance between region 110 and region 103, the distance between region 111 and region 103, and the bias voltage of the photodiode, are for example selected so that the electric field at the level of the central portion of the PN junction (at the interface between region 105 and the central portion 103a of region 103) is sufficiently intense for the avalanche to be started by a single photogenerated charge, for example, is greater than 300 kV/cm across a thickness from 100 nm to 500 nm, and so that the electric field at the level of the peripheral portion of the PN junction (at the interface between substrate 101—the doping level of which may have locally increased due to the forming of buried region 111— and the peripheral portion 103b of region 103) is sufficiently small for the avalanche not to be started by a single photogenerated charge, for example, is smaller than 300 kV/cm. As an example, the reverse breakdown voltage (or avalanche voltage) of the photodiode is in the range from 10 V to 50 V, and the reverse bias voltage of the photodiode is greater than its breakdown voltage by a value in the range from 0.5 V to 10 V.

The substrate 101 of photodiode 100 is preferably lightly doped to ease the collection of the charges photogenerated in depth in substrate 101. As illustrated by the equipotential lines drawn in FIG. 1, the electric field resulting from the reverse biasing of the peripheral portion of the PN junction remains confined within regions 110 and 111, and does not or only slightly extends in the lower portion of substrate 101 (that is, in the portion of substrate 101 located outside of the separation well formed by regions 110, 111, and 105). In other words, in the embodiment of FIG. 1, the equipotential lines have rounded protrusions around the peripheral portion of the PN junction, but these protrusions remain confined within regions 110 and 111, and do not extend under the central portion of the photodiode. The electric field resulting from the reverse biasing of the central portion of the PN junction extends in depth in substrate 101, under region 105. From a given depth p in substrate 101, substantially corresponding to the depth of the lower surface of region 111, the field lines take a flared shape, and an electric field pointing towards the avalanche area of the photodiode develops under a portion at least of the peripheral portion of the PN junction. Thus, in the example of FIG. 1, the width of collection of the charges photogenerated in the substrate is always at least substantially equal to the width of the avalanche area (that is, substantially equal to the width of region 105), and may be greater than the width of the avalanche area for charges photogenerated in depth in substrate 101. More particularly, due to the continuity of the separation well formed by regions 110 and 111, the structure of FIG. 1 benefits from a "lens" effect, which makes it particularly adapted to the collection of charges photogenerated in depth in substrate 101.

Preferably, in the structure of FIG. 1, to enable to collect charges photogenerated in depth in substrate 101, that is, under region 105, substrate 101 is lightly doped, for example, with a doping level smaller than $5*10^{14}$ atoms/$cm^3$. As an example, substrate 101 may be a non-intentionally doped semiconductor substrate, that is, a substrate having its P-type doping only resulting from its incidental contamination by impurities on manufacturing thereof. As an example, the doping level of region 103 is in the range from $5*10^{17}$ atoms/$cm^3$ to $5*10^{19}$ atoms/$cm^3$, the doping level of region 105 is in the range from $1*10^{16}$ atoms/$cm^3$ to $5*10^{17}$ atoms/$cm^3$, the doping level of region 110 is in the range from $5*10^{17}$ atoms/$cm^3$ to $5*10^{19}$ atoms/$cm^3$, and the doping level of region 111 is in the range from $1*10^{16}$ atoms/$cm^3$ to $5*10^{17}$ atoms/$cm^3$. The distance between region 103 and region 110 and the distance between region 103 and region 111 are preferably such that the distance between the contour of the N-type dopant element concentration at $10^{17}$ atoms/$cm^3$ and the contour of the P-type dopant element concentration at $10^{17}$ atoms/$cm^3$ is at least 0.2 µm at the level of the peripheral portion of the PN junction.

As illustrated in FIG. 1, as a result of the low doping level of substrate 101, the electric field generated by the reverse biasing of the photodiode extends in depth into substrate 101, at a distance from the PN junction of the photodiode. Under the effect of this electric field, the charges photogenerated in substrate 101, in the case in point, electrons, are driven towards the PN junction by following a trajectory parallel to the electric field. As a variation, the extension of the electric field across the thickness of substrate 101 may also be obtained with a substrate having a higher doping level, provided to significantly increase the reverse bias voltage of the photodiode.

Figure 2:
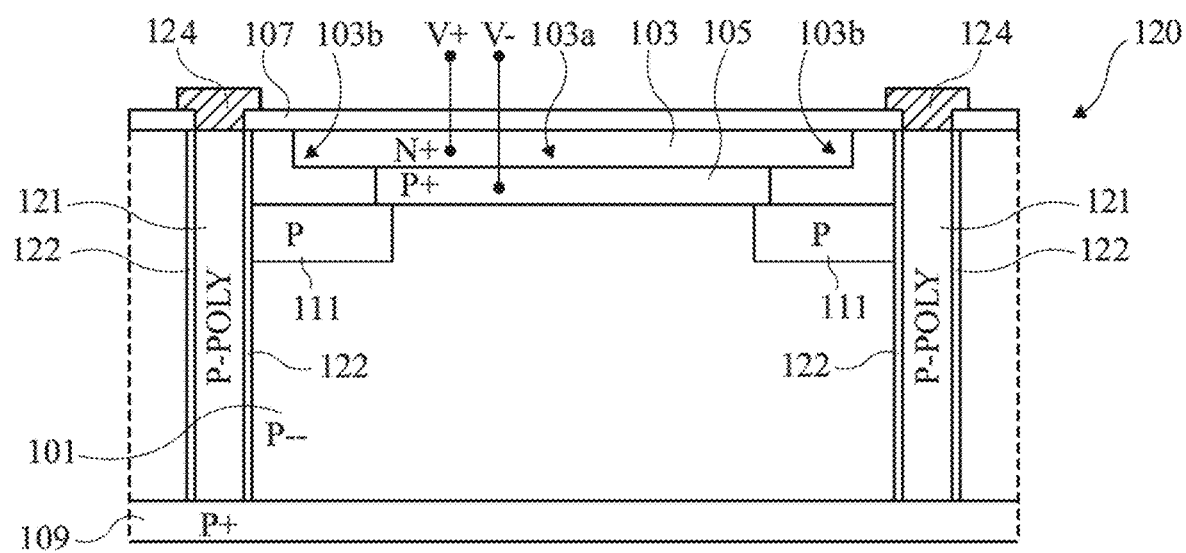
FIG. 2 is a partial simplified cross-section view of another example of a SPAD photodiode.

FIG. 2 is a partial simplified cross-section view of another example of a SPAD photodiode 120. The SPAD photodiode 120 of FIG. 2 comprises many elements in common with the SPAD photodiode 100 of FIG. 1. The common elements are not described again. In the following, only the differences between the structure of FIG. 1 and the structure of FIG. 2 will be detailed.

The photodiode 120 of FIG. 2 differs from the photodiode 100 of FIG. 1 essentially in that, in the example of FIG. 2, a peripheral trench 121 filled with P-type doped polysilicon is substituted to the P-type doped substrate region 110 of the structure of FIG. 1. Trench 121 extends vertically from the upper surface of the substrate down to a depth greater than that of region 103, and forms a peripheral ring totally surrounding region 103 in top view. In the shown example, trench 121 extends all the way to layer 109, and emerges into layer 109. Trench 121 is not isolated from substrate 101, that is, the P-type doped polysilicon filling trench 121 is in contact with substrate 101 at the level of the walls of trench 121. Preferably, a region 122 having a doping level greater than that of substrate 101 extends in substrate 101 from the lateral walls of trench 121. To form region 122, an anneal of the structure may for example be provided after the filling of the trench with P-type doped polysilicon, to diffuse into substrate 101 P-type dopant elements originating from the polysilicon. The provision of region 122 enables to avoid for the electric field lines to reach the walls of trench 121, which might attract parasitic charges generated at the interface with trench 121 towards the avalanche area. The doping level of the polysilicon filling trench 121 is greater than that of substrate 101. The doping level in trench 121 is for example greater than that of region 105. A non-zero distance preferably separates region 103 from trench 121.

The photodiode 120 of FIG. 2 comprises a buried P-type region 111 substantially identical to that of photodiode 100 of FIG. 1, connecting trench 121 to region 105 all along the periphery of the PN junction. Thus, regions 121, 111, and 105 form a continuous separation well totally surrounding the lateral surfaces and the lower surface of region 103, and interposed between region 103 and the lower portion of substrate 101.

Due to the continuity of the separation between region 103 and the lower portion of substrate 101, the structure of FIG. 2 provides, identically or similarly to what has been described in relation with FIG. 1, a significant improvement in the efficiency of the collection of the charges photogenerated in depth in the substrate.

As an example, as shown in FIG. 2, the biasing of the anode region of the photodiode may be performed via trench 121. To achieve this, a connection metallization 124 may be arranged in contact with the upper surface of trench 121, in an opening formed in passivation layer 107.

Figure 3:
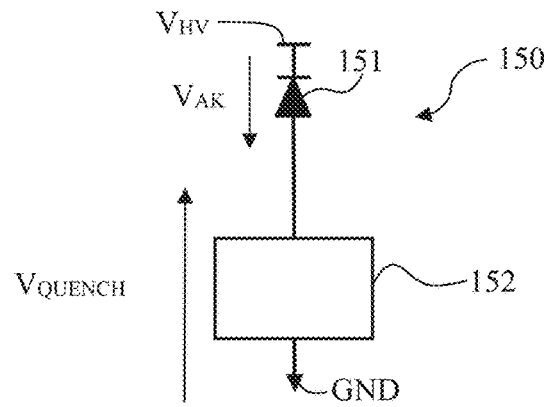
FIG. 3 is an electric diagram of an electronic circuit comprising a SPAD photodiode and a circuit for quenching the SPAD photodiode.

FIG. 3 is an electric diagram of an electronic circuit 150 comprising a SPAD photodiode 151, for example having the structure shown in FIG. 1 or 2. The cathode of SPAD photodiode 151 is coupled to a source of a high reference potential $V_{HV}$. The anode of SPAD photodiode 151 is coupled, preferably connected, to a first terminal of a quenching circuit 152 having a second terminal coupled, preferably connected, to a source of an intermediate reference potential GND, for example, the ground. As a variant, quenching circuit 152 may be located between the cathode of SPAD photodiode 151 and the source of high reference potential $V_{HV}$, where the anode of SPAD photodiode 151 can then be directly coupled to the source of intermediate reference potential GND, taken for example equal to 0 V. According to another variant, quenching circuit 152 may be located between the cathode of SPAD photodiode 151 and the source of intermediate reference potential GND, taken for example as equal to 0 V, where the anode of SPAD photodiode 151 can then be directly coupled to a source of low reference potential $V_{BV}$, for example, negative. Call $V_{AK}$ the voltage between the anode and the cathode of SPAD photodiode 151 and $V_{QUENCH}$ the voltage between the first terminal and the second terminal of quenching circuit 152. Potential V+ is then equal to $V_{HV}$ and potential V− is equal to $V_{QUENCH}$ so that voltage $V_{AK}$ is equal to $V_{QUENCH}-V_{HV}$.

The voltage $V_{AK}$ applied between the anode and the cathode of SPAD photodiode 151 during the detection phase is greater, in absolute value, that the breakdown voltage Vbv of the SPAD photodiode by a voltage Vex. During a triggering of the SPAD photodiode, quenching circuit 152 temporarily lowers voltage $V_{AK}$ in absolute value substantially down to Vbv to stop the avalanche and then takes back voltage $V_{AK}$ in absolute value to Vbv+Vex for a new detection phase.

Figure 4:
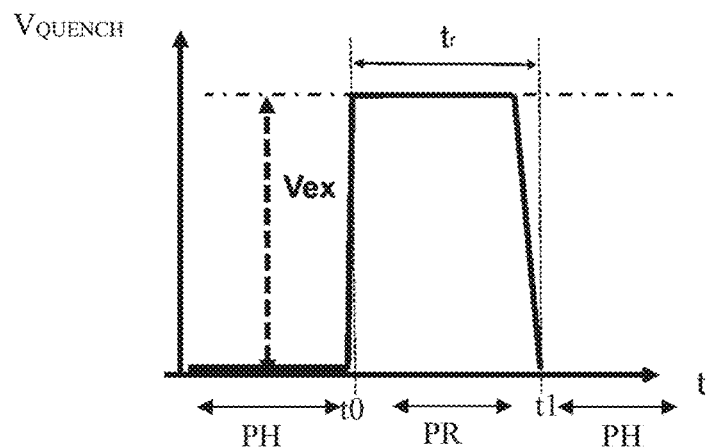
FIG. 4 is a timing diagram of the voltage across the quenching circuit of FIG. 3 during the operation of the SPAD photodiode.

FIG. 4 is a timing diagram of voltage $V_{QUENCH}$. As previously described, during a detection phase PH, the anode of SPAD photodiode 151 is biased via quenching circuit 152 so that voltage $V_{AK}$ is equal to −(Vbv+Vex). When the avalanche of the SPAD photodiode is detected, quenching circuit 152 controls the increase of voltage $V_{QUENCH}$ by value Vex so that voltage $V_{AK}$ switches at time t0 to −Vbv for a duration tr, called recharge time, to cause the stopping of the avalanche. At time t1 equal to t0+tr, quenching circuit 152 controls the decrease of voltage $V_{QUENCH}$ by value Vex so that voltage $V_{AK}$ switches −(Vbv+Vex) to start a new detection phase PH. Two successive detection phases are thus separated by a recharge phase PR having a duration equal to recharge time tr. It is desirable for recharge time tr to be minimum to be able to count a maximum number of incident photons.

Figure 5:
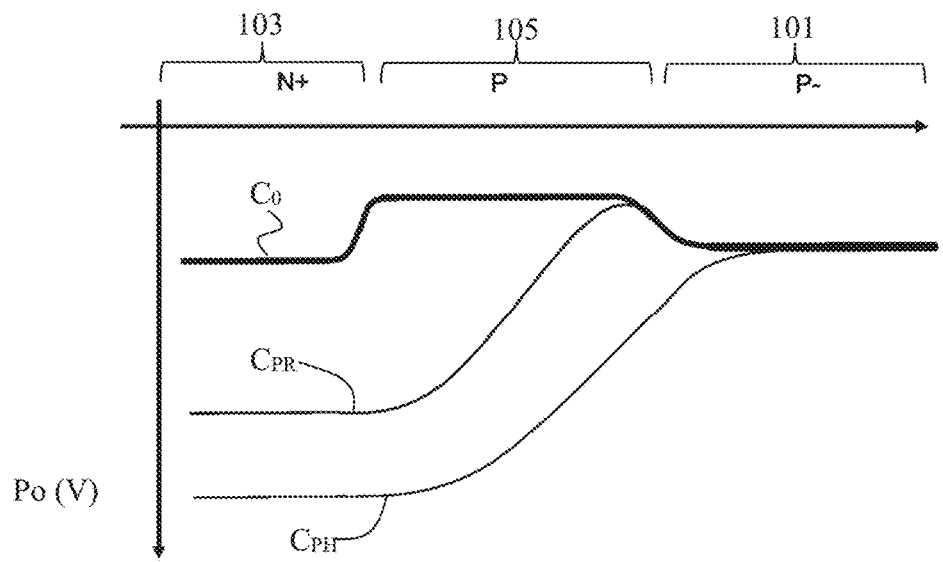
FIG. 5 shows curves of variation of the potential in regions of the SPAD photodiode during the operation of the photodiode.

FIG. 5 shows curves $C_0$, $C_{PH}$, and $C_{PR}$ of variation of potential Po in volts in regions 103 and 105 and in the substrate 101 of the SPAD photodiode for example along the axis of symmetry of the structure at different times during the operation of the photodiode. Curve $C_0$ corresponds to the case where voltage $V_{AK}$ is zero. Curve $C_{PH}$ corresponds to a detection phase PH and curve $C_{PR}$ corresponds to a recharge phase PR.

The avalanche occurs at the junction between heavily N-type doped region 103 (N+) and P-type doped region 105. There is a strong generation of charge carriers in this area during the avalanche, the electric field accelerating electrons towards N-type doped region 103 while holes are discharged to P-type doped region 105.

Figure 6:
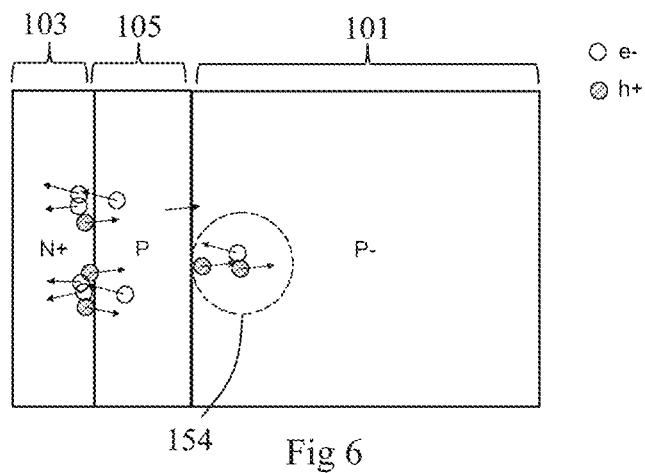
FIG. 6 illustrates a first phenomenon of generation of electron/hole pairs capable of occurring during the avalanche of the SPAD photodiode.
Figure 7:
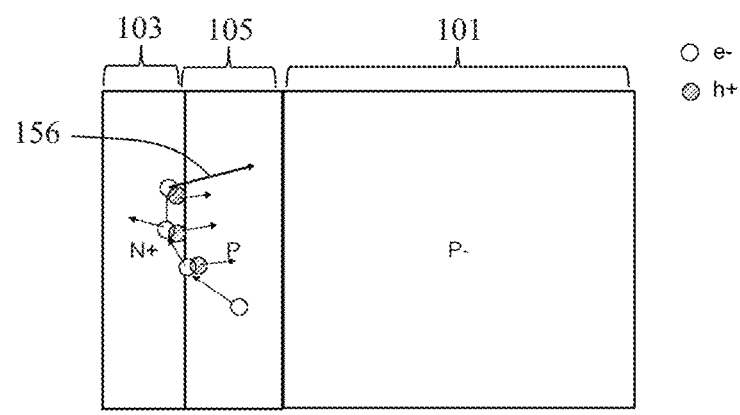
FIG. 7 illustrates a second phenomenon of generation of electron/hole pairs capable of occurring during the avalanche of the SPAD photodiode.

FIGS. 6 and 7 illustrate two phenomena of generation of electron/hole pairs capable of occurring during the avalanche of the SPAD photodiode. In these drawings, each electron e− is shown by an empty circle and each hole h+ is shown by a hatched circle. FIG. 6 illustrates a phenomenon of generation of an electron/hole pair, indicated by circuit 154 in dashed lines, in the lightly-doped P-type substrate 101 (P−) during the transiting of the holes in substrate 101 to the depletion area. There can thus be an electron generation outside of the interface between region 103 (N+) and region 105 (P). FIG. 7 illustrates a phenomenon of kinetic origin capable of resulting in the same result. The electrons generated during the avalanche may be generated in multiple directions. Some are generated with a kinetic energy pushing them out of the interface between region 103 (N+) and region 105 (P) towards substrate 101 (P−) (an example is indicated by arrow 156).

At the blocking of the SPAD photodiode after the detection of the avalanche, voltage $V_{AK}$ rises back to −Vbv. As illustrated by curve CPR in FIG. 5, this causes the forming of a potential barrier between P-type doped region 105 (P) and lightly P-type doped substrate 101 (P−). The electrons which were located in substrate 101 should have reached N-type doped region 103 due to the electric field present, but are blocked in substrate 101 (P−). If there remain charges in substrate 101 (P−) at the blocking, these cannot be discharged all the way to region 103. At the end of the recharge phase and at the beginning of the next detection phase, the potential barrier disappears as illustrated by curve $C_{PH}$ in FIG. 5. These charges remaining in substrate 101 will then join the depletion area and may trigger the SPAD photodiode, even in the absence of a photon. This parasitic phenomenon prevents the fast recharge of the SPAD photodiode and may cause false detections.

Figure 8:
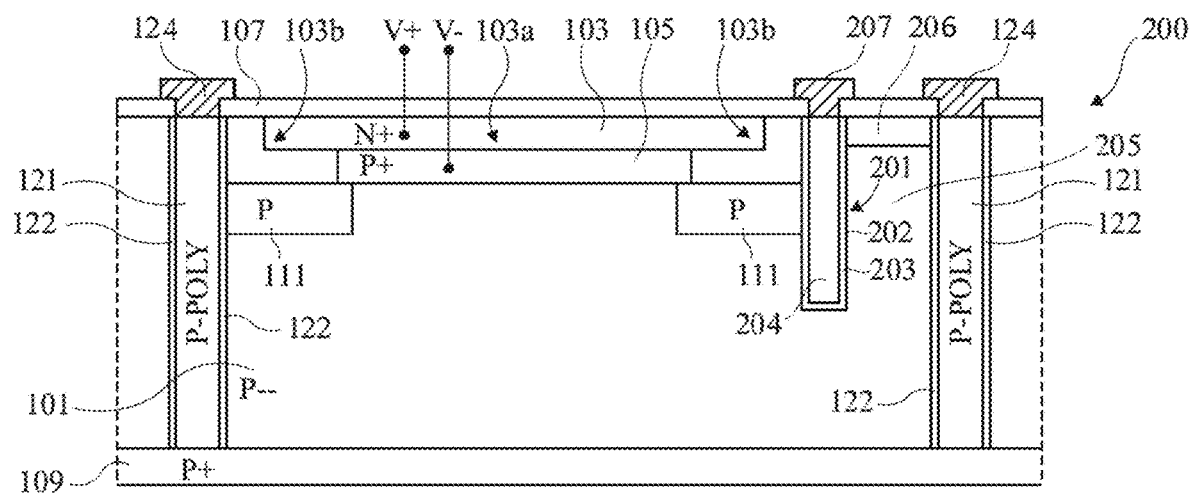
FIG. 8 is a partial simplified cross-section view of an embodiment of a SPAD photodiode.
Figure 9:
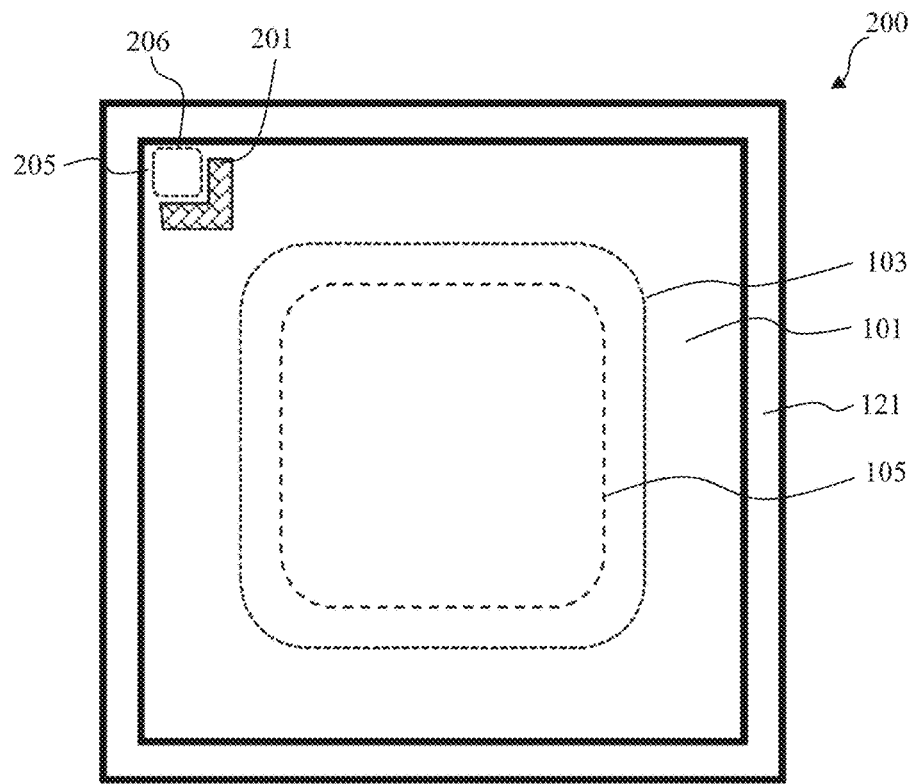
FIG. 9 is a partial simplified top view of the embodiment of a SPAD photodiode shown in FIG. 8.

FIGS. 8 and 9 respectively are a cross-section view and a top view, partial and simplified, of an embodiment of a SPAD photodiode 200.

The SPAD photodiode 200 of FIGS. 8 and 9 comprises all the elements of the SPAD photodiode 120 of FIG. 2 and further comprises a gate 201 extending in substrate 101. Gate 201 is formed by a trench 202 having its walls covered with an insulating layer 203, for example, made of silicon oxide, and which is filled with a conductive material 204, for example, P-type doped polysilicon. Gate 201 extends vertically in substrate 101 from the upper surface of substrate 101 down to a depth, also called height, greater than the depth of the lower surface of region 105 and, preferably, greater than the depth of the lower surface of region 111. Gate 201 separates a portion 205 of substrate 101 from the rest of substrate 101. The height of gate 201 is smaller than the thickness of substrate 101. The thickness of gate 201 may be in the range from 300 nm to 4 μm, for example, equal to approximately 2 μm. The thickness of insulating layer 203 may be in the range from 5 nm to 50 nm, preferably from 10 nm to 50 nm, more preferably from 20 nm to 40 nm, for example, equal to approximately 30 nm. A heavily-doped N-type region 206 extends, in this portion 205, from the surface of substrate 101 down to a depth of the same order as region 103. FIG. 8 shows a connection metallization 207 in contact with the upper surface of conductive material 204, in an opening formed in passivation layer 107.

Figure 10:
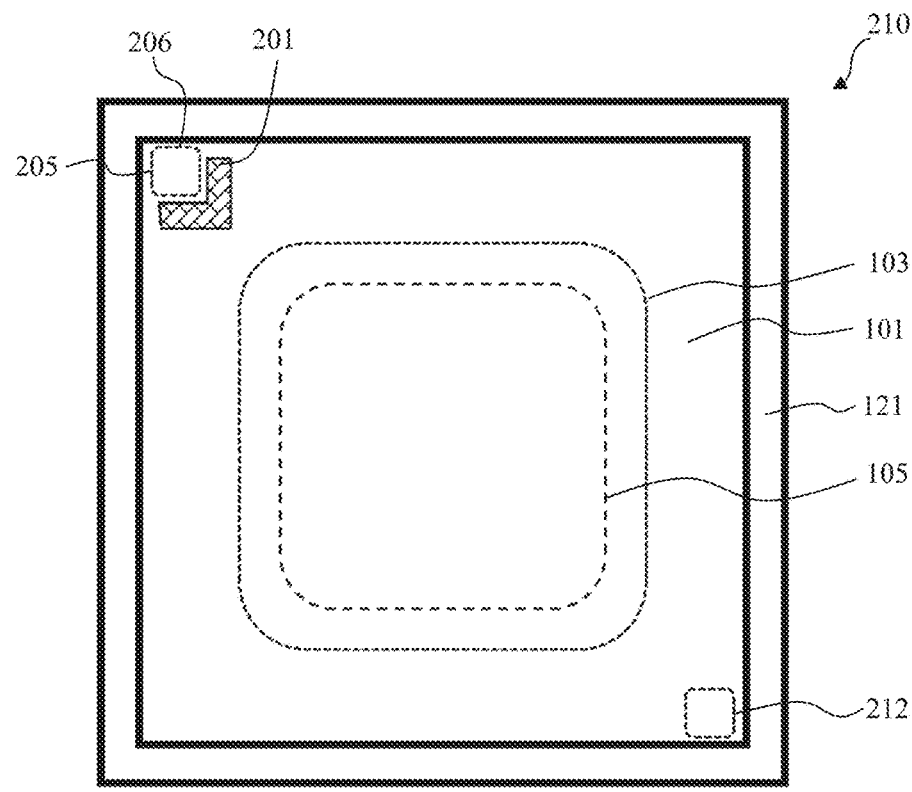
FIG. 10 is a partial simplified top view of another embodiment of a SPAD photodiode.

FIG. 10 is a partial simplified top view of another embodiment of a SPAD photodiode 210.

SPAD photodiode 210 comprises all the elements of the SPAD photodiode 200 shown in FIG. 8, with the difference that region 122 corresponds to a dielectric layer, for example, a silicon oxide layer. As shown in FIG. 10, SPAD photodiode 210 further comprises a heavily-doped P-type region 212 extending in substrate 101 from the surface of substrate 101 and coming into contact with ring 111. Region 212 is used for the biasing of ring 111. Region 212 may be coupled to circuit 152.

Figure 11:
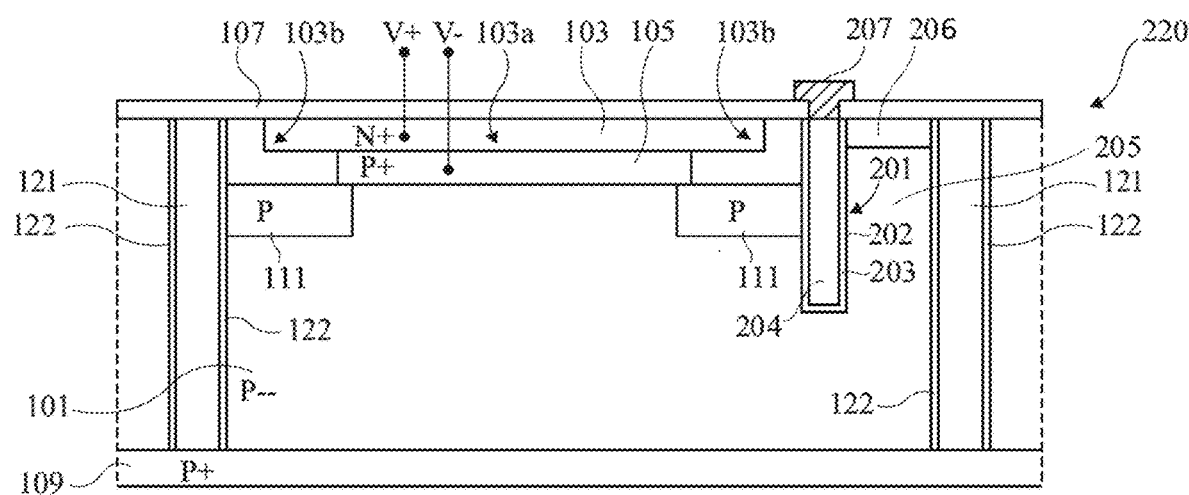
FIG. 11 is a partial simplified cross-section view of another embodiment of a SPAD photodiode.

FIG. 11 is a partial simplified cross-section view of another embodiment of a SPAD photodiode 220.

SPAD photodiode 220 comprises all the elements of the SPAD photodiode 200 shown in FIG. 8, with the difference that trench 121 is filled with a dielectric material and that region 122 is obtained by implantation of dopants on the sides of trench 121. SPAD photodiode 220 may further comprise region 212, such as shown in FIG. 10 and not shown in FIG. 11, for the biasing of ring 111.

Figure 12:
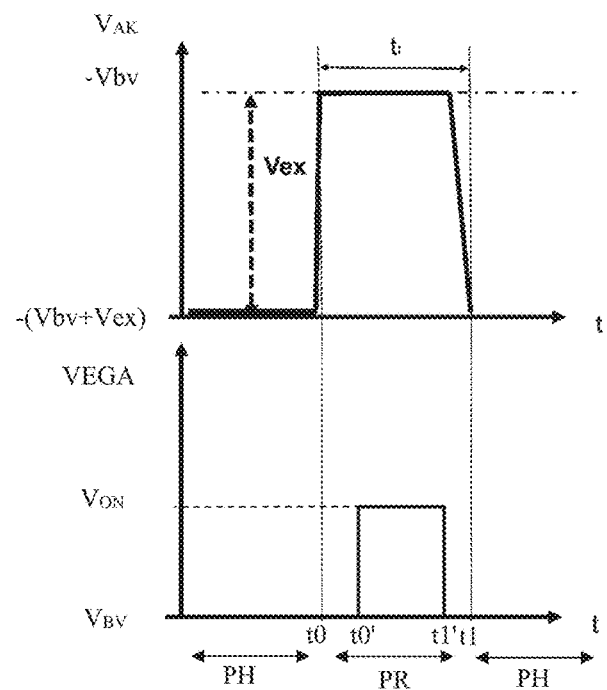
FIG. 12 is a timing diagram of signals for controlling the SPAD photodiode shown in FIGS. 8 and 9.

FIG. 12 is a timing diagram of signals for controlling the modes of the SPAD photodiode 200, 210, 220 shown in FIGS. 8 to 11. More precisely, FIG. 12 shows voltage $V_{AK}$ and the potential VEGA applied to gate 201.

A positive potential is permanently applied to N-type doped region 206, for example, a potential between 1.8 V and 3 V. For each detection phase PH, a negative potential is applied to gate 201. This enables to passivate with holes the interface between the oxide layer 203 of gate 201 and substrate 101. This avoids an unwanted triggering of the SPAD photodiode due to interface problems. The presence of gate 201 then does not modify the operation of the SPAD photodiode.

After time t0, which indicates the beginning of a recharge phase PR, a positive potential $V_{ON}$ is applied to gate 201 at a time t0' preceding time t1, which indicates the end of a recharge phase PR. Potential $V_{ON}$ is for example equal to 1.8 V. The electrons possibly present in substrate 101 at the end of detection phase PH are then discharged to N-type doped region 206. At a time t1' which follows time t0' and preceding time t1, negative potential $V_{BV}$ is applied again to gate 201. At time t1, a new selection phase PH starts. In FIG. 12, the potential applied to gate 201 has been shown in the form of a step. In practice, the potential applied to gate 201 may have a shape different from a step as long as it has a sufficiently high value for a sufficiently long time to enable, during recharge phase PR, to discharge the electrons present in substrate 101 to region 206.

For the embodiment of a SPAD photodiode 210 illustrated in FIG. 10, trench 121 is biased so that interface 122 is passivated. As an example, it may be taken to negative potential $V_{BV}$.

Figure 13:
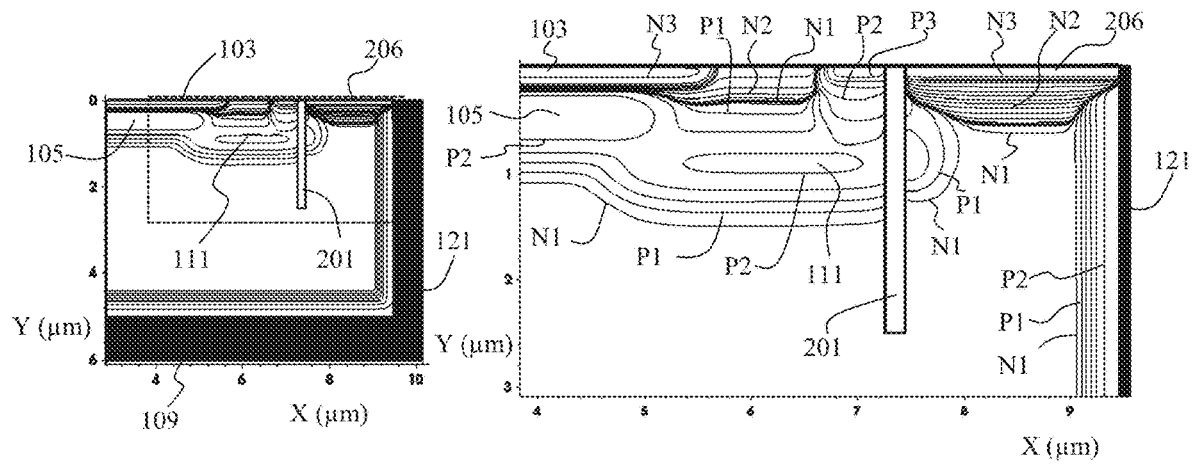
FIG. 13 comprises, in its left-hand portion, a cross-section view, and in its right-hand portion, a detail cross-section view of the SPAD photodiode structure used for simulations.

FIG. 13 comprises, in its left-hand portion a cross-section view, and in its right-hand portion, a detail cross-section view of the SPAD photodiode structure used to perform simulations. The considered structure is similar to that shown in FIG. 11 and had a symmetry of revolution around the Y axis. FIG. 13 further shows contour lines of the dopant concentration in the SPAD photodiode. As an example, contour lines N1, N2, and N3 correspond to N-type dopant concentrations respectively equal to $4.6*10^{14}$ atoms/cm$^3$, $3*10^{17}$ atoms/cm$^3$, and $2*10^{20}$ atoms/cm$^3$, and contour lines P1, P2, and P3 correspond to P-type dopant concentrations respectively equal to $2*10^{14}$ atoms/cm$^3$, $1.5*10^{17}$ atoms/cm$^3$, and $1*10^{20}$ atoms/cm$^3$. The thickness of gate 201, measured along the X axis, was 2 μm.

Simulations have been performed for different heights of gate 201 along the Y axis. For the simulations, positive potential $V_{HV}$ is applied to region 103 and a positive potential equal to 3.3 V is applied to region 206.

Figure 14:
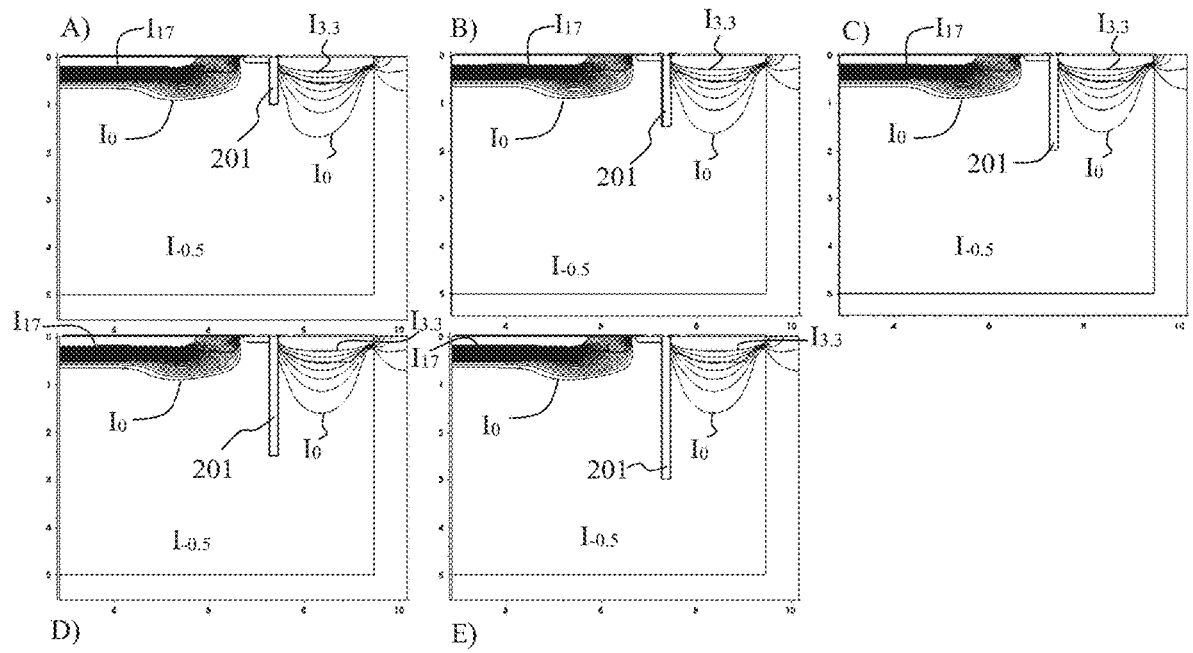
FIG. 14 shows isopotential lines for the structure shown in FIG. 13 for different gate heights in a first biasing configuration.

FIG. 14 comprises views A), B), C), D), and E) showing isopotential lines obtained for gate heights 201 respectively equal to 1 μm, 1.5 μm, 2 μm, 2.5 μm, and 3 μm obtained when a negative −1−V potential is applied to gate 201 during a detection phase PH. Reference $I_{-0.5}$ designates the regions of the SPAD photodiode where the potential is between 0 V and −1 V. References $I_0$, $I_{3.3}$ and $I_{17}$ designate isopotential lines corresponding to potentials respectively equal to 0 V, 3.3 V, and 17 V. These views show that gate 201 isolates region 206 during a detection phase and there will accordingly be no impact on the operation of the SPAD photodiode.

Figure 15:
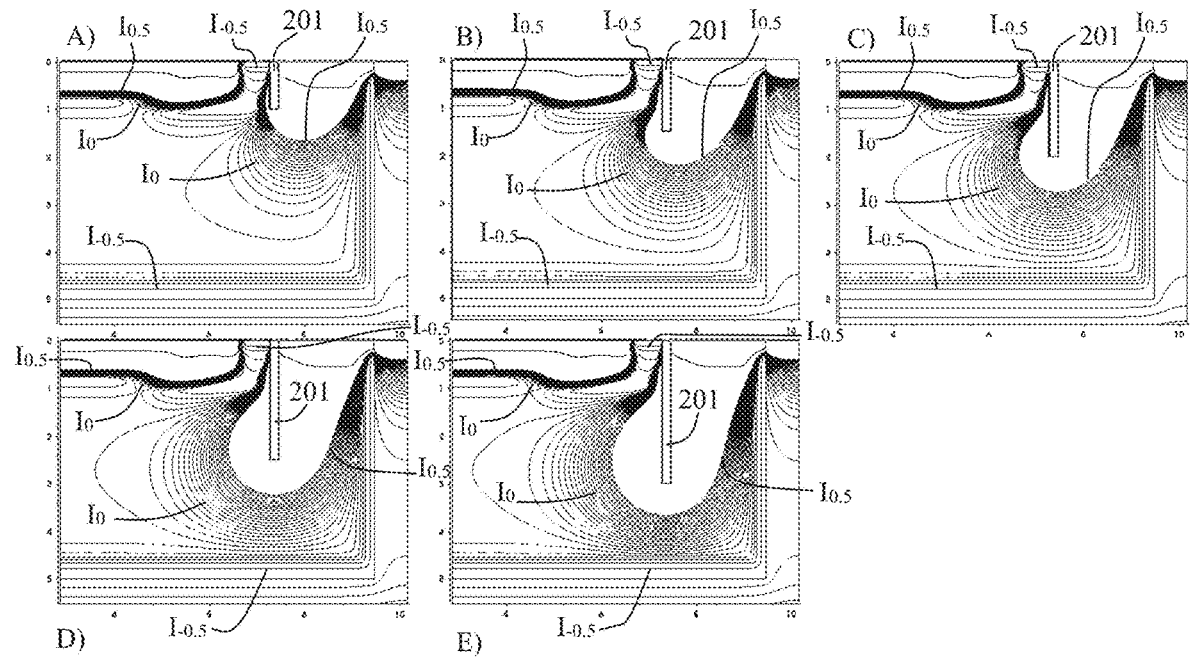
FIG. 15 shows isopotential lines for the structure shown in FIG. 13 for different gate heights in a second biasing configuration.
Figure 16:
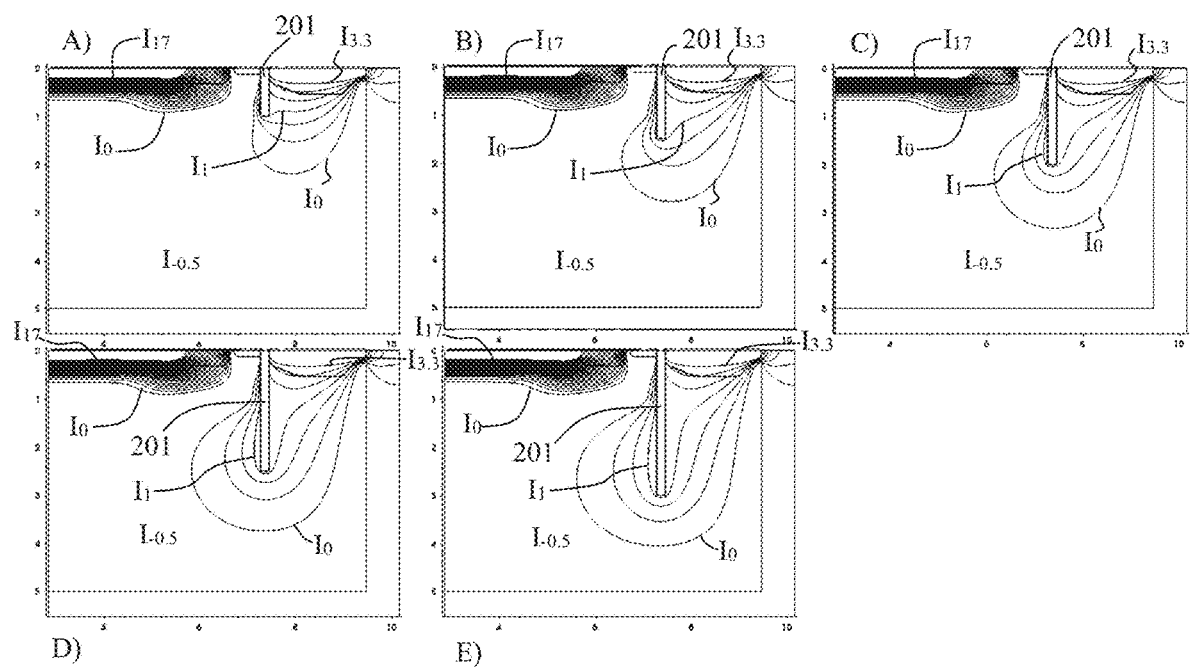
FIG. 16 shows other isopotential lines for the structure shown in FIG. 13 for different gate heights in the second biasing configuration.

FIGS. 15 and 16 each comprise views A), B), C), D), and E) containing isopotential lines obtained for heights of gate 201 respectively equal to 1 μm, 1.5 μm, 2 μm, 2.5 μm, and 3 µm when a 1.8-V positive potential is applied to gate 201. In FIG. 15, references $I_{-0.5}$, $I_0$, $I_{0.5}$, $I_{3.3}$, and $I_{17}$ designate isopotential lines corresponding to the potentials respectively equal to −0.5 V, 0 V, 0.5 V, 3.3 V, and 17 V. In FIG. 16, reference $I_{-0.5}$ designates the regions of the SPAD photodiode SPAD where the potential is between 0 V and −1 V. References $I_0$, $I_1$, $I_{3.3}$ and $I_{17}$ designate isopotential lines corresponding to the potentials respectively equal to 0 V, 1 V, 3.3 V, and 17 V. These isopotential curves illustrate the fact that the electric field in substrate 101 guides electrons towards region 206.

Figure 17:
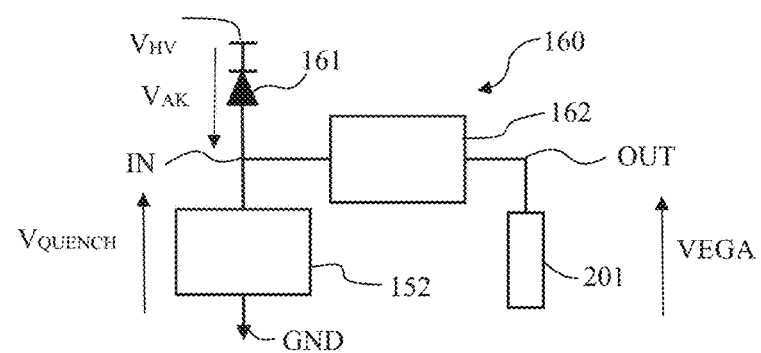
FIG. 17 is an electric diagram of an electronic circuit comprising a SPAD photodiode.

FIG. 17 is an electric diagram of an electronic circuit 160 comprising a SPAD photodiode 161 having the structure shown in FIG. 3, a quenching circuit 152, such as previously described, and a circuit 162 for controlling gate 201 comprising an input IN coupled to the anode of SPAD photodiode 161 and an output OUT delivering potential VEGA to gate 201 according to the timing diagram shown in FIG. 12.

Figure 18:
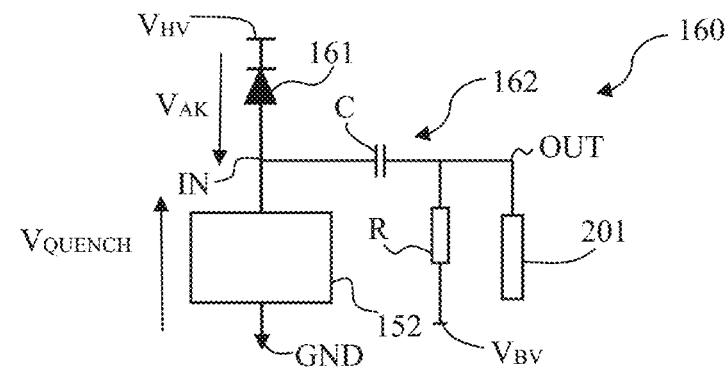
FIG. 18 is an electric diagram of a more detailed embodiment of the electronic circuit of FIG. 17.

FIG. 18 is an electric diagram of a more detailed embodiment of electronic circuit 160. In this embodiment, control circuit 162 comprises a capacitor C having a plate coupled, preferably connected, to the input IN of control circuit 162, and having its other plate coupled, preferably connected, to the output OUT of control circuit 162. Control circuit 162 further comprises a resistor R having a terminal coupled, preferably connected, to the output OUT of control circuit 162 and having its other terminal coupled, preferably connected, to the source of a low reference potential $V_{BV}$, smaller than potential GND.

Figure 19:
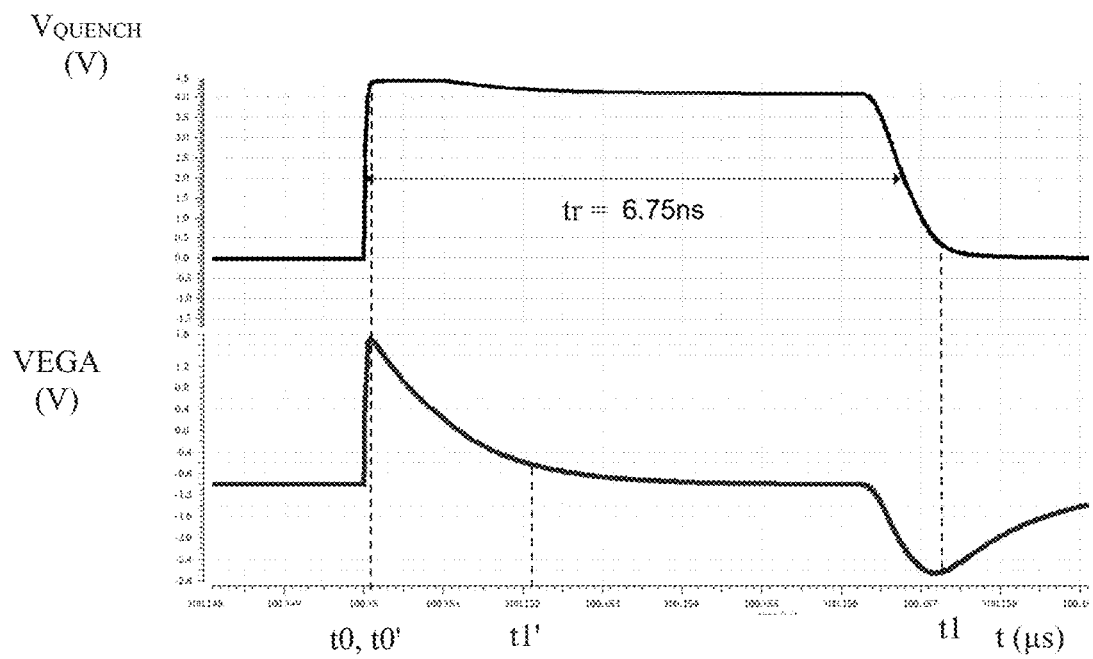
FIG. 19 is a timing diagram of voltages during the operation of the electronic circuit shown in FIG. 18.

FIG. 19 shows timing diagrams of voltages $V_{QUENCH}$ and VEGA obtained by simulation with the control circuit 162 of FIG. 18. For this simulation, the capacitance of gate 201 is taken as equal to 25 fF. This corresponds to a 3-µm depth and a 2-µm width. The capacitance of capacitor C has to be greater than the capacitance of vertical gate 201. For the simulation, the capacitance of capacitor C is taken as equal to 50 fF. The resistance used for the simulation is 15 kΩ. The presence of capacitor C causes an increase in potential VEGA when voltage $V_{QUENCH}$ increases. Potential VEGA then returns to an equilibrium value with a time constant which depends on resistance R. The temporary decrease of potential VEGA when voltage $V_{QUENCH}$ decreases has not effect upon the operation of control circuit 162. In this embodiment, the previously-described times t0 and t0' are substantially confounded.

Figure 20:
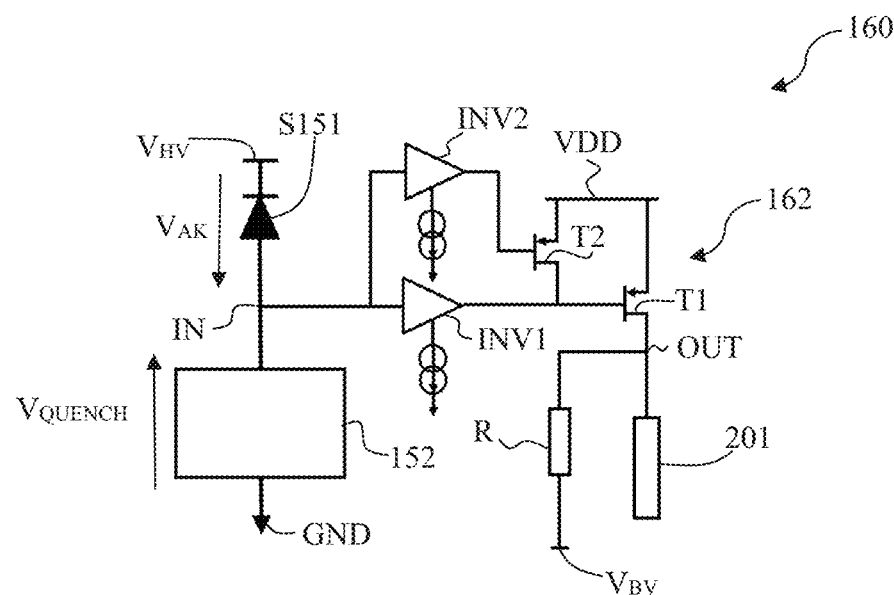
FIG. 20 is an electric diagram of another more detailed embodiment of the electronic circuit of FIG. 17.

FIG. 20 is an electric diagram of another more detailed embodiment of electronic circuit 160. In this embodiment, control circuit 162 comprises, as for the embodiment shown in FIG. 18, resistor R having a terminal coupled, preferably connected, to the output OUT of control circuit 162 and having its other terminal coupled, preferably connected, to the source of a low reference potential $V_{BV}$. Control circuit 162 further comprises a first current-limited inverter INV1 having its input coupled, preferably connected, to the input IN of control circuit 162 and having its output coupled, preferably connected, to the gate of a MOS transistor T1, for example, with a P channel, having its source coupled, preferably connected, to a source of a high potential VDD and having its drain coupled, preferably connected, to the output OUT of control circuit 162. Control circuit 162 further comprises a second current-limited inverter INV2 having its input coupled, preferably connected, to the input IN of control circuit 162 and having its output coupled, preferably connected, to the gate of a MOS transistor T2, for example, with a P channel, having its source coupled, preferably connected, to the source of high potential VDD and having its drain coupled, preferably connected, to the gate of transistor T1. Inverters INV1 and INV2 are current-limited, which signifies that the maximum current capable of crossing them is limited. Inverters INV1 and INV2 are configured so that the operating delay of inverter INV2 is greater than the operating delay of inverter INV1. This means that the duration between the reception of a signal by inverter INV2 and the delivery by inverter INV2 of an "inverted" signal is greater than the duration between the reception of a signal by inverter INV1 and the delivery by inverter INV1 of an "inverted" signal.

Figure 21:
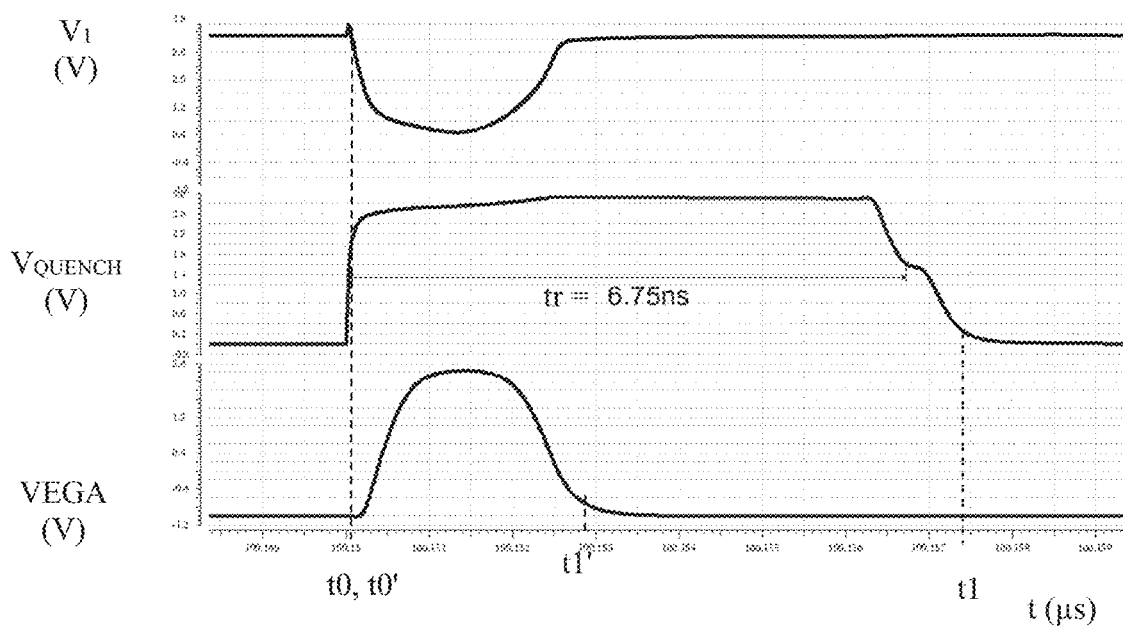
FIG. 21 is a timing diagram of voltages during the operation of the electronic circuit shown in FIG. 20.

FIG. 21 shows timing diagrams of voltage $V_{QUENCH}$, of the voltage $V_1$ at the gate of transistor T1, and of potential VEGA obtained by simulation with the control circuit 162 of FIG. 20. For this simulation, gate capacitance 201 is taken as equal to 25 fF. This corresponds to a 3-µm depth and a 2-µm width. The resistance used for the simulation is 15 kΩ. When voltage $V_{QUENCH}$ rises at time t0, inverter INV1 imposes a voltage $V_1$ to the gate of transistor T1 in order to turn it on. Voltage VEGA then rises up to VDD. Inverter INV2 imposes after the elapsing of a delay a voltage $V_2$ to the gate of transistor T2 to turn it on. Transistor T2 is configured, inverter INV1 being current-limited, to then impose an increase of voltage $V_1$. This causes the turning on of transistor T1 and a decrease in potential VEGA. The discharge of the voltage onto gate 201 is performed through resistor R.

Various embodiments and variants have been described. Those skilled in the art will understand that certain features of these various embodiments and variants may be combined, and other variants will occur to those skilled in the art. In particular, the above-described advantages may be obtained by inverting all the conductivity types with respect to the described examples and by accordingly adapting the control voltages. Further, the embodiment described in relation with FIG. 3 may be implemented with the structure of the SPAD photodiode described in relation with FIG. 1.

Further, it should be noted that the lower layer 109 of the described examples, of the same conductivity type as the substrate but of higher doping level, is optional. The provision of layer 109 has the advantage of limiting risks of injection, into the avalanche area, of parasitic charges generated on the back side of the substrate. Layer 109 further enables to set the potential of the lower surface of the substrate and to ensure a fine deployment of the electric field across the entire thickness of the substrate. Layer 109 may however be omitted, particularly in the case of a photodiode intended to be front-side illuminated.

Further, although in the previously-described embodiments, the SAPD photodiode comprises a ring 111 which advantageously improves the collection of the charges generated in depth in the substrate, it should be clear that gate 201 may be implemented with a SPAD photodiode comprising no ring 111.

Further, although in the previously-described embodiments, the SPAD photodiode comprises a single gate 201, it should be clear that the SPAD photodiode may comprise two gates 201 or more than two gates which may be provided at different locations of the SPAD photodiode, where gates 201 can be controlled simultaneously.

The present invention can be applied to other structures of SPAD photodiodes than those disclosed above. In particular, the present invention can be applied to the SPAD photodiode structure disclosed in document US 2018/0090536 or in document US 2018/0019268. By way of example, gate 201 of the embodiments disclosed above can be added to the structure of SPAD photodiode shown in FIG. 4A of document US 2018/0090536, with gate 201 extending into substrate 402 shown in FIG. 4A of document US 2018/0090536 from face 410 deeper than layer 408. By way of example, gate 201 of the previously described embodiments can be added to the SPAD photodiode structure shown in FIG. 4A of document US 2018/0019268, with gate 201 extending into substrate 418 shown in FIG. 4A of document US 2018/0019268 from the top face deeper than region 422.

Finally, the practical implementation of the described embodiments and variations is within the abilities of those skilled in the art based on the functional indications given hereabove.

The invention claimed is:

1. An apparatus, comprising:
a SPAD-type photodiode comprising:
   a depletion area, in which a photogenerated electric charge can be injected to trigger an avalanche of the SPAD-type photodiode, in a first portion of a semiconductor substrate of a first conductivity type;
   a gate electrically insulated from the substrate, extending into the substrate from an upper surface of the substrate down to a depth smaller than the thickness of the substrate, and separating the first portion of the substrate from a second portion; and
   a first region of the second conductivity type extending from the upper surface of the substrate into the second portion,
   wherein the second portion of the substrate does not have a depletion area in which a photogenerated electric charge can be injected to trigger an avalanche of the SPAD-type photodiode.

2. The apparatus according to claim 1, further comprising a circuit of application of a bias voltage to said depletion area, said voltage being equal in absolute value to a first value greater than the avalanche voltage of the photodiode during a first phase and equal in absolute value to a second value smaller than the first value during a second phase, and of application of a potential to the gate at a third value adapted to repelling the minority free charge carriers of the substrate during the first phase and a fourth value adapted to attracting the minority free charge carriers of the substrate during part of the second phase.

3. The apparatus according to claim 1, wherein the doping level of the substrate is smaller than $5*10^{14}$ atoms/cm$^3$.

4. The apparatus according to claim 1, wherein the photodiode comprises, in the first portion of the substrate:
   a second region of the second conductivity type extending from the upper surface of the substrate; and
   a third region of the first conductivity type having a doping level greater than that of the substrate, extending from the lower surface of the second region opposite to the upper surface of the substrate, the third region having, in top view, a surface area smaller than that of the second region and being located opposite a central portion of the second region.

5. The apparatus according to claim 4, wherein the photodiode comprises:
   a fourth region of the first conductivity type having a doping level greater than that of the substrate extending from the upper surface of the substrate; and
   a fifth buried region of the first conductivity type having a doping level greater than that of the substrate, forming a peripheral ring coupling the third region to the fourth region so that the lateral surfaces and the lower surface of the second region are totally surrounded by the assembly formed by the third, fourth, and fifth regions.

6. The apparatus according to claim 5, wherein the fourth region laterally surrounds the second region.

7. The apparatus according to claim 5, wherein the doping level of the fourth region is greater than or equal to that of the third region.

8. The apparatus according to claim 5, wherein the thicknesses E105 and E111 of the third and fifth regions, and the doping levels C105 and C111 of the third and fifth regions are such that product C111*E111 is greater than or equal to product C105*E105.

9. The apparatus according to claim 5, wherein the fourth and fifth regions are not in contact with the second region.

10. The apparatus according to claim 5, wherein the depth of the gate in the substrate with respect to the upper surface of the substrate is greater than the depth of the lower surface of the third region with respect to the upper surface of the substrate.

11. The apparatus according to claim 10, wherein the depth of the gate in the substrate with respect to the upper surface of the substrate is greater than the depth of the lower surface of the fifth region with respect to the upper surface of the substrate.

12. Method of controlling the apparatus according to claim 1 comprising:
   the application of a bias voltage to said depletion area, said voltage being equal in absolute value to a first value greater than the avalanche voltage of the photodiode during a first phase and equal in absolute value to a second value smaller than the first value during a second phase; and
   the application of a potential to the gate at a third value adapted to repelling the minority free charge carriers of the substrate during the first phase and at a fourth value adapted to attracting the minority free charge carriers of the substrate during part of the second phase.

* * * * *